United States Patent
Aston

(10) Patent No.: US 9,072,184 B2
(45) Date of Patent: Jun. 30, 2015

(54) CARBON FIBER SPACECRAFT PANEL WITH INTEGRAL METALLIC FOIL POWER RETURN

(71) Applicant: The Boeing Company, Chicago, IL (US)

(72) Inventor: Richard W. Aston, Brea, CA (US)

(73) Assignee: The Boeing Company, Chicago, IL (US)

( * ) Notice: Subject to any disclaimer, the term of this patent is extended or adjusted under 35 U.S.C. 154(b) by 379 days.

(21) Appl. No.: 13/659,092

(22) Filed: Oct. 24, 2012

(65) Prior Publication Data

US 2014/0110158 A1   Apr. 24, 2014

(51) Int. Cl.
*H05K 1/09* (2006.01)
*H05K 1/03* (2006.01)

(52) U.S. Cl.
CPC ........................................ *H05K 1/09* (2013.01)

(58) Field of Classification Search
CPC ............. H05K 1/09; H05K 1/03; H05K 1/02; H05K 3/04; H05K 3/103; H05K 3/281; H05K 2201/10151; H05K 2201/1028; H05K 3/0058; B64G 1/42; H01L 23/12; H01L 23/14; B29C 35/0272; B29C 70/86; B29C 70/885; B64C 27/473; B64C 2027/7283; Y02T 50/34
USPC ................. 244/1 A; 156/577, 307.1
See application file for complete search history.

(56) References Cited

U.S. PATENT DOCUMENTS

| | | | |
|---|---|---|---|
| 4,273,818 A * | 6/1981 | Buchs ........................... | 428/116 |
| 5,310,141 A * | 5/1994 | Homer et al. ............... | 244/158.1 |
| 8,031,458 B2 * | 10/2011 | Braden et al. ................. | 361/218 |
| 2001/0042593 A1 * | 11/2001 | Zhou et al. .................. | 156/307.1 |
| 2007/0177330 A1 * | 8/2007 | Ackerman et al. ............ | 361/220 |
| 2007/0298663 A1 * | 12/2007 | Marshall et al. .......... | 439/620.22 |
| 2008/0275173 A1 | 11/2008 | Aoki | |
| 2008/0290222 A1 | 11/2008 | Aston et al. | |
| 2009/0001217 A1 * | 1/2009 | Dufresne et al. .............. | 244/119 |
| 2009/0258220 A1 * | 10/2009 | Schaaf et al. ................. | 428/332 |
| 2010/0127564 A1 * | 5/2010 | Braden et al. .................. | 307/9.1 |
| 2010/0151239 A1 * | 6/2010 | Hebert et al. ................. | 428/351 |
| 2010/0213312 A1 * | 8/2010 | Robb ........................... | 244/1 A |
| 2010/0319969 A1 * | 12/2010 | Vasoya et al. ................. | 174/257 |
| 2011/0114895 A1 | 5/2011 | Lengsfeld | |
| 2011/0236622 A1 * | 9/2011 | Tacke et al. ................... | 428/114 |
| 2012/0074261 A1 | 3/2012 | Dolzinski et al. | |

* cited by examiner

*Primary Examiner* — Timothy Thompson
*Assistant Examiner* — Michael F McAllister
(74) *Attorney, Agent, or Firm* — Thompson Hine LLP

(57) ABSTRACT

An aerospace structure that includes a composite member and a conductive element attached to the composite member wherein the conductive element is configured to conduct electricity across at least a portion of the composite member is provided. The aerospace structure may also include a power distribution system and the conductive element is a part of the power distribution system for the aerospace structure.

19 Claims, 3 Drawing Sheets

CARBON FIBER SPACECRAFT PANEL WITH INTEGRAL METALLIC FOIL POWER RETURN

FIELD

The present application relates to composite members including an integral metallic foil power return, more particularly, to carbon fiber spacecraft panels with an integral metallic foil power return.

BACKGROUND

Carbon fiber reinforced plastic ("CFRP") materials are increasingly being used in place of metals to form the skin panels and primary structural members of many structures, including aerospace structures. CFRP materials are advantageous compared to metals due to the higher strength-to-weight ratios provided by these materials. However, CFRP materials are much less conductive than metallic materials, and as a result require special consideration with respect to handling electric current. In a spacecraft or other aerospace structure, one way of returning D.C. current from the unit to the battery ground is through the wire harness. Alternatively, in structures composed of conductive metallic panels such as aluminum alloy, the current may be returned through the structure itself to eliminate the return harness. The fibers in CFRP are somewhat conductive, but not nearly as conductive as aluminum. Due to the intrinsic resistance of composite materials as compared to aluminum, structures composed almost entirely of composite materials are not suitable for returning current through the structure. Therefore, it would be desirable to have a method and structure that provides for power return in a structure composed almost entirely of composite materials that avoids the need for a separate wire harness.

SUMMARY

The present application relates to an aerospace structure that includes a composite member and a conductive element attached to the composite member wherein the conductive element is configured to conduct electricity across at least a portion of the composite member. The aerospace structure also includes a power distribution system and the conductive element is a part of the power distribution system for the aerospace structure. In accordance with certain aspects, the conductive element may be a metallic foil such as aluminum, iron, gold, silver or copper. The conductive element may be attached to the composite member before, during or after formation of the composite member.

According to another embodiment, a method of returning current through an aerospace structure is provided. In one aspect, a power distribution system is provided comprising a composite member and a conductive element attached to the composite member and electricity is conducted through the conductive element across at least a portion of the composite member. According to certain aspects, the power distribution system may be a power return path for an aerospace structure such as an aircraft, a spacecraft or a satellite. In accordance with certain aspects, the conductive element is a metallic foil. In accordance with certain embodiments, the metallic foil may be provided as a continuous sheet capable of providing high amperage direct current carrying capability.

According to yet another embodiment, a spacecraft is provided. In one aspect, the spacecraft includes a composite member and a conductive element attached to the composite member wherein the conductive element is configured to conduct electricity across at least a portion of the composite member. The composite member may be a spacecraft panel. The spacecraft may also include a power distribution system and the conductive element is a part of the power distribution system for the spacecraft. In accordance with certain aspects, the conductive element may be a metallic foil such as aluminum, iron, gold, silver or copper. The conductive element may be attached to the composite member before, during or after formation of the composite member.

The features, functions, and advantages that have been discussed can be achieved independently in various embodiments of the present invention or may be combined in yet other embodiments further details of which can be seen with reference to the following description and drawings.

DETAILED DESCRIPTION

Figure 1:
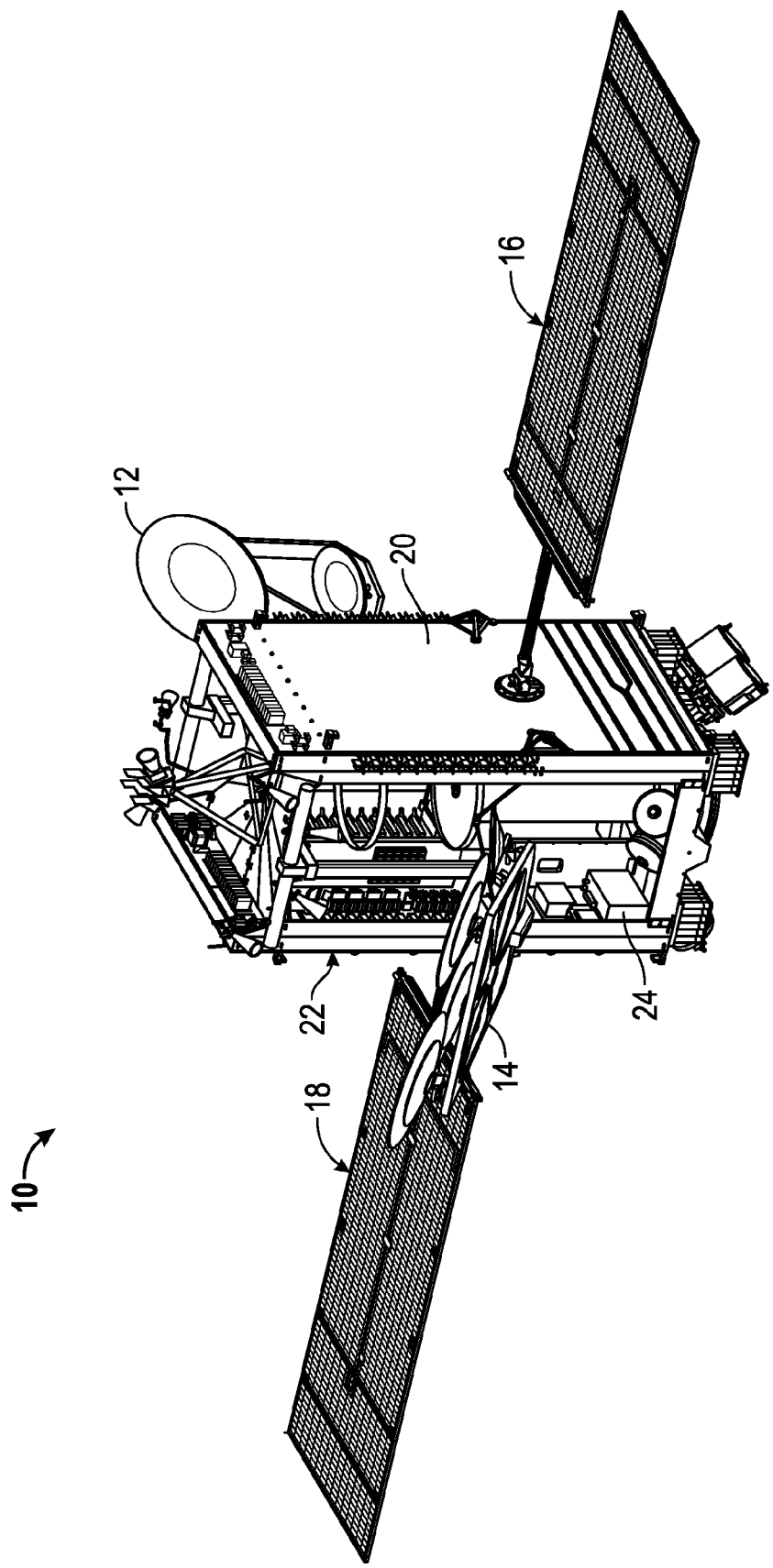
FIG. 1 is a schematic, perspective view of a spacecraft.

As shown in FIG. 1, the spacecraft, generally designated 10, may be a satellite. Although the present description is directed to a satellite, the spacecraft or aerospace structure can also be any other vehicle or structure that could benefit from using a conductive element to conduct electricity across at least a portion of a composite member. Examples of other aerospace structures that can benefit from using a conductive element to conduct electricity across a portion of a composite member include, but are not limited to, an aircraft, a spacecraft, and a satellite.

As shown in FIG. 1, the spacecraft 10 may include antenna reflectors 12, 14, and solar arrays 16, 18. Spacecraft 10 also includes radiator panels 20, 22. The radiator panels move heat from the electronics and also act as a supporting structural member for the spacecraft.

Also shown in FIG. 1 is the power distribution unit 24. The power distribution unit 24 sends power to different payload units in the spacecraft 10 through wires and the power returns to the power distribution unit 24 through the structure of the spacecraft itself.

Figure 2:
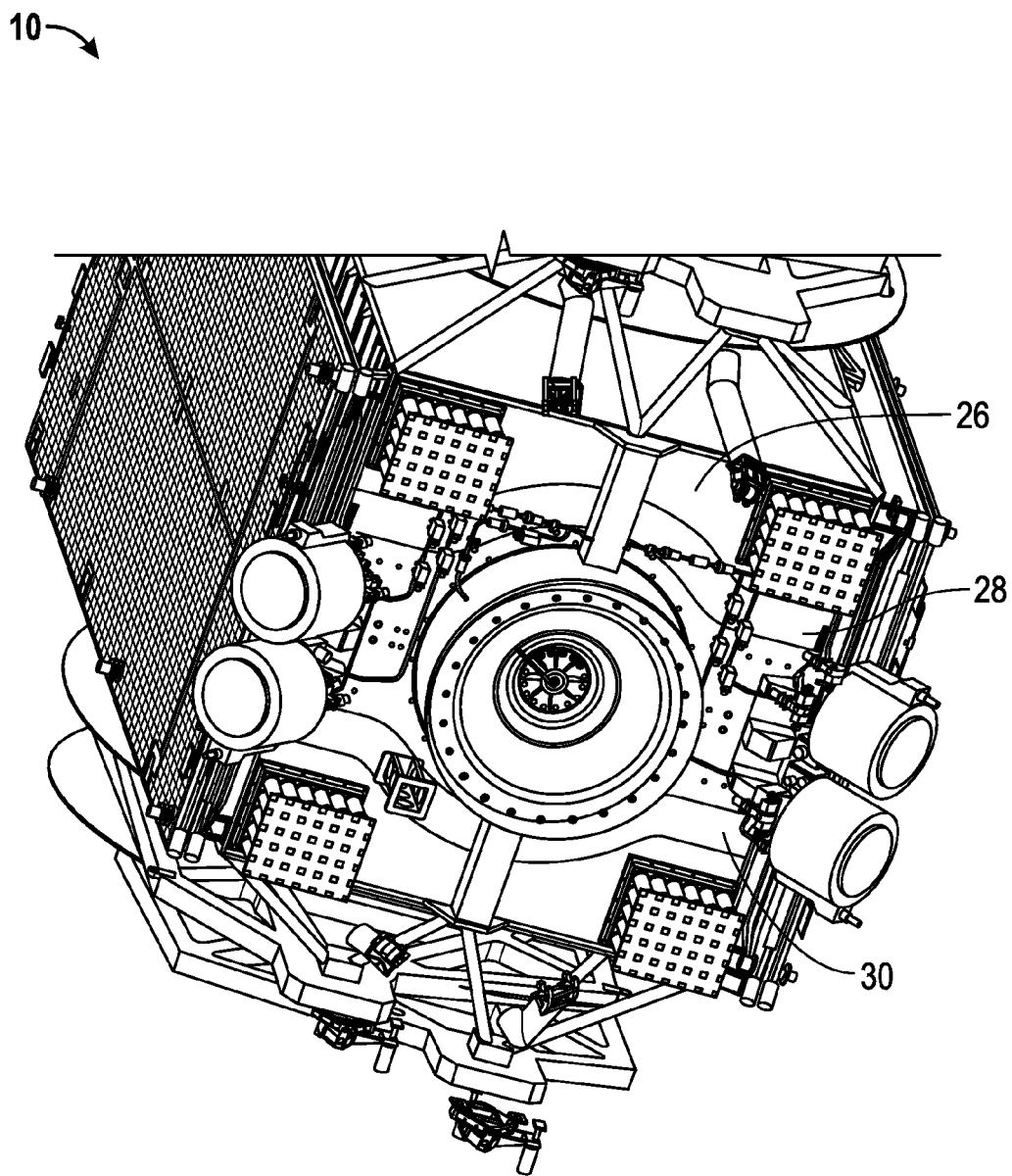
FIG. 2 is a schematic, perspective view of the aft-side panel of the spacecraft depicted in FIG. 1.
Figure 3:
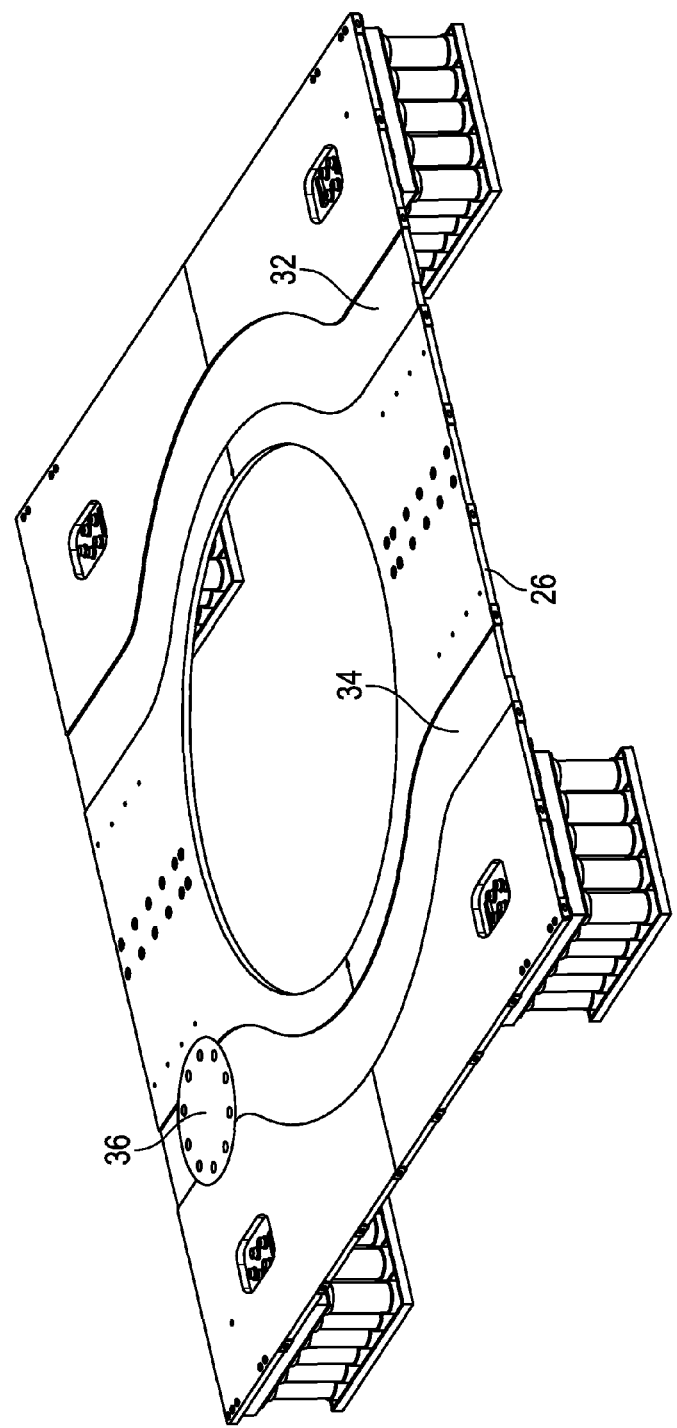
FIG. 3 is a schematic, perspective view of the forward-side of the spacecraft aft panel depicted in FIG. 2.

FIG. 2 shows the aft panel 26 of the spacecraft 10. The aft panel 26 comprises composite materials such as a solid carbon fiber reinforced polymer laminate or an aluminum honeycomb panel with carbon fiber face sheets. A "composite" structure comprises a plurality of layers of a structured fabric within a resin matrix. Carbon fiber reinforced polymer (CFRP) materials are one example of appropriate composite structures. The fibers in CFRP are somewhat conductive, but not nearly as conductive as aluminum. Therefore, any spacecraft structure wherein the conductive metallic panels are replaced by this conductive materials such as composite materials, the spacecraft structure must be modified to provide for other paths for the current to return to the battery ground. As shown in FIGS. 2 and 3, conductive elements 28 and 30 are provided on the aft side of the aft panel and conductive elements 32 and 34 are provided on the forward side of the aft panel.

The conductive elements may be a portion of the power distribution system for the spacecraft and provide a path for the DC current to return to the battery ground 36. The conductive elements 28, 30, 32 and 34, according to certain embodiments, are metallic foil. The metallic foil may comprise at least one of aluminum, iron, gold, silver and copper. Alloys may also be used. Aluminum metallic foil is particularly useful because of its low mass, high electrical conductivity, and resistance to oxidation. In accordance with certain embodiments, the metallic foil may have a thickness of about 0.003-0.008, more particularly about 0.003-0.005 and in certain cases about 0.004 inches. The conductive element may be formed as strips or continuous sheets wherein the conductive element provides high amperage direct current carrying capability.

The conductive element may be attached to the composite panel or other composite member using any method that allows the conductive element to conduct electricity across at least a portion of the composite panel or composite member. In accordance with one embodiment, the conductive element is attached to the composite member prior to curing of the composite member. In accordance with this embodiment, the conductive element is co-cured with the layers of materials and resin making up the composite member. In accordance with one embodiment, the composite member comprises a CFRP composite. In this manner, the composite member may be denoted as a composite spacecraft panel. A CFRP composite may comprise a large number of layers arranged in a particular order one after the other. Each of the CFRP layers is produced from a CFRP composite material using, for example, epoxy resin or thermoplastic polymers or the like. In accordance with the present embodiment, the conductive element such as a metal foil layer is applied to the upper layer of the CFRP composite and co-cured with the other layers of the CFRP composite.

In accordance with another embodiment, the CFRP composite is formed first and then the conductive element such as a metal foil layer is attached to the composite member by bonding the conductive element to the composite member after curing of the composite member. Methods of bonding the conductive element to the composite member are not particularly limited. Examples of particularly useful bonding materials include, without limitation, epoxies, resins, and pressure-sensitive adhesives. Preferably, the conductive element is continuously bonded to the composite member. Air bubbles should be avoided as any air bubbles in the adhesive layer could result in delamination.

In accordance with another aspect of the present disclosure, a method of returning current through an aerospace structure is provided. In one embodiment, a power distribution system is provided comprising a composite member and a conductive element attached to the composite member and electricity is conducted through the conductive element across at least a portion of the composite member. In particular embodiments, a power distribution unit or integrated power controller sends power to different payload units throughout the structure through wires and the current is returned through the structure by way of the conductive element to the battery ground.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other illustrative embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. An aerospace structure comprising:
   a composite member comprising an aluminum honeycomb panel covered with a plurality of carbon fiber face sheets, the composite member including a forward surface; and
   a power distribution system, comprising:
   a battery ground disposed along the forward surface of the composite member;
   a conductive element disposed along the forward surface of the composite member, the conductive element being configured to conduct electricity across at least a portion of the composite member and provides a direct path for a DC current to return to the battery ground.

2. The aerospace structure of claim 1 wherein the conductive element is a metallic foil.

3. The aerospace structure of claim 2 wherein the metallic foil comprises at least one of aluminum, iron, gold, silver, and copper.

4. The aerospace structure of claim 3 wherein the metallic foil has a thickness of about 0.003-0.008 inches.

5. The aerospace structure of claim 2; wherein the metallic foil comprises a continuous sheet, the continuous sheet providing direct current carrying capability.

6. The aerospace structure of claim 1 wherein the conductive element is attached to the composite member either prior to or during curing of the composite member.

7. The aerospace structure of claim 1 wherein the conductive element is attached using a bonding material, the conductive element being bonded to the composite member after curing of the composite member.

8. The aerospace structure of claim 7 wherein the bonding material includes at least one of epoxy, resin, or pressure-sensitive adhesive.

9. The aerospace structure of claim 1 wherein the composite member is at least a portion of a power return path for a spacecraft.

10. The aerospace structure of claim 1 wherein the aerospace structure is a satellite, aircraft or spacecraft.

11. A method of returning current through an aerospace structure comprising: providing an aerospace structure comprising a power distribution system and a composite member comprising an aluminum honeycomb panel covered with a plurality of carbon fiber face sheets, wherein the power distribution system comprises a battery ground disposed along a forward surface of the composite member, and a conductive element disposed along the forward surface of the composite member; and conducting electricity through the conductive element across at least a portion of the composite member and providing a direct path for a DC current to return to the battery ground.

12. The method of claim 11 wherein the power distribution system comprises an integrated power controller, wherein the integrated power controller sends power to at least one payload unit in the aerospace structure and the current is returned through the structure by way of the conductive element to the battery ground.

13. The method of claim 11 wherein the conductive element is an aluminum metallic foil.

14. The method of claim 13 wherein the aluminum metallic foil has a thickness of about 0.003-0.005 inches.

15. The method of claim 13 wherein the metallic foil comprises a continuous sheet, the continuous sheet providing direct current carrying capability.

16. The method of claim 11 wherein the conductive element is attached to the composite member either prior to or during curing of the composite member.

17. A spacecraft comprising:
a composite spacecraft panel comprising an aluminum honeycomb panel covered with a plurality of carbon fiber face sheets, the composite member including a forward surface; a composite spacecraft panel wherein the a power distribution system comprising a conductive element disposed along the forward surface of the composite spacecraft panel and the conductive element is configured to conduct electricity across at least a portion of the composite spacecraft panel and provide a direct path for a DC current to return to the battery.

18. The spacecraft of claim 17 wherein the conductive element is a metallic foil comprising at least one of aluminum, iron, gold, silver, and copper.

19. The spacecraft of claim 18 wherein the metallic foil comprises a continuous sheet, the continuous sheet providing high amperage direct current carrying capability.

* * * * *